United States Patent [19]

Driscoll

[11] Patent Number: 4,550,293
[45] Date of Patent: Oct. 29, 1985

[54] NARROW DEVIATION VOLTAGE CONTROLLED CRYSTAL OSCILLATOR

[75] Inventor: Michael M. Driscoll, Catonsville, Md.

[73] Assignee: The United States of America as represented by the Secretary of the Air Force, Washington, D.C.

[21] Appl. No.: 574,434

[22] Filed: Jan. 27, 1984

[51] Int. Cl.⁴ ............................................. H03B 5/36
[52] U.S. Cl. .............................. 331/116 R; 331/158; 331/177 V; 331/159
[58] Field of Search .......... 331/36 C, 116 FE, 116 R, 331/158, 159, 177 V

[56] References Cited

U.S. PATENT DOCUMENTS

| | | | |
|---|---|---|---|
| 2,820,145 | 1/1958 | Wolfendale | 250/36 |
| 3,569,865 | 3/1971 | Healey | 331/159 |
| 3,571,754 | 3/1971 | Healey et al. | 331/116 |
| 3,747,023 | 7/1973 | Hoft et al. | 332/26 |
| 3,836,873 | 9/1974 | Healey et al. | 331/116 R |
| 3,916,344 | 10/1975 | Enderby | 331/116 R |
| 4,088,968 | 5/1978 | Pradal et al. | 332/26 |
| 4,134,085 | 1/1979 | Driscoll et al. | 331/116 R |
| 4,199,734 | 4/1980 | Dressen | 331/76 |
| 4,375,621 | 3/1983 | Schneiter et al. | 332/16 T |

OTHER PUBLICATIONS

Michael M. Driscoll, *HF and VHF Source Stabilization Technique Incorporating Q-Multiplied Quartz Crystal Resonator*, IEEE Transactions on Instrumentation and Measurement, vol. IM-23, No. 2, Jun. 1974, pp. 131–140.

Primary Examiner—Eugene R. LaRoche
Assistant Examiner—James C. Lee
Attorney, Agent, or Firm—Donald J. Singer; Richard J. Donahue

[57] ABSTRACT

A narrow band, voltage controlled crystal oscillator having a linear frequency versus tuning voltage response. The oscillator uses a composite resonator in a novel circuit configuration with a resulting improvement in oscillator output signal frequency stability.

8 Claims, 6 Drawing Figures

NARROW DEVIATION VOLTAGE CONTROLLED CRYSTAL OSCILLATOR

STATEMENT OF GOVERNMENT INTEREST

The invention described herein may be manufactured and used by or for the Government for governmental purposes without the payment of any royalty thereon.

BACKGROUND OF THE INVENTION

Voltage controlled crystal oscillators (VCXO) are well known in the art and generally comprise a voltage tunable resonator having a crystal unit and a voltage variable capacitance coupled across a sustaining stage such as an appropriately biased transistor amplifier.

One such VCXO is disclosed in U.S. Pat. No. 3,571,754 issued to Daniel J. Healey III and the present inventor on Mar. 23, 1971. As disclosed therein, the oscillator employs a high Q composite resonator that consists of a network containing a quartz crystal unit, in combination with capacitors, inductors and varactor (voltage variable capacitance) diodes. Oscillator operation occurs at the parallel resonant frequency of the resonator, designed specifically to exhibit a near linear relationship between resonant frequency and applied varactor tuning voltage. In addition to the desired (high Q) resonance, the composite resonator exhibits two undesired resonances occuring typically at 95% and 120% of the desired frequency, and use of a spurious suppression network is required to eliminate the possibility of oscillator operation at the undesired resonances. The particular circuit configuration was a direct result of a requirement for relative wide tuning range (0.25% typical). Varactor diode operation over a tuning voltage range resulting in 1.5 to 1 maximum usable diode reactance ratio defines oscillator frequency sensitivity to circuit component change. For example, a VCXO tuning 2500 PPM using 100 pF effective tuning diode capacitance operated at 5 to 14 volts tuning voltage will have a worst case frequency sensitivity to capacitance change (at the varactor diode circuit node) of approximately 150 PPM/pF. Because of this fact, it is usually necessary to temperature control and hermetically seal the oscillator circuit. In currently utilized applications for narrow deviation VCXO's where much lower tuning range is required (250 PPM typical), a wide deviation VCXO design is often utilized with tuning diode operation over a much smaller applied tuning voltage. The result of this is needless use of very much reduced diode reactance variation (10% or less), with no improvement in oscillator sensitivity to circuit element change, compared to a VCXO having 10 times larger tuning capability.

A narrow deviation VCXO developed by the present inventor and Rafi Arekelian is described in U.S. Pat. No. 4,134,085 issued on Jan. 9, 1979. In this VCXO circuit, a linear tuning characteristic is achieved using the large available tuning diode reactance variation (approximately 1.5 to 1 for 5 to 14 volts) resulting in much reduced oscillator output signal frequency sensitivity to circuit component reactance changes. In addition this circuit utilizes a reduced number of critical components, and does not require use of a spurious suppression network. While a spurious resonance exists for the composite resonator 10 shown in U.S. Pat. No. 4,134,085, it is lossier than the desired resonance and of little concern. The composite resonator is located in the base circuit of the sustaining stage transistor and operates as a parallel resonant circuit. Because of this, the oscillator circuit disclosed in U.S. Pat. No. 4,134,085 exhibits a noise floor typically 15-20 dB higher than the circuit disclosed and claimed herein.

The spectral density of the fractional phase fluctuations of the output signal in the oscillator circuits described above can be expressed as:

$$S\delta\phi(f) = 2[(Ko/f + K1)(fo/2Qf)^2 + K2]$$

where:
Ko = oscillator open loop flicker noise constant
K1 = oscillator open loop white noise constant
fo = carrier frequency
Q = effective (loaded) composite resonator Q
K2 = "residual" oscillator white noise constant for oscillator noise sources not subject to band limiting by the composite resonator frequency selectivity characteristic (K2 can have a 1/f component).

FIG. 1 shows (in general form) the resulting oscillator short-term stability. $\zeta(f) = 10 \log (S\delta\phi(f)/2)$ and is defined as the ratio of the power in one phase noise sideband, on a per Hertz bandwidth spectral density basis, to the total signal power, at Fourier frequency f from the carrier. As shown in FIG. 1, there is a conversion of oscillator (open loop) white phase noise to white frequency noise (20 dB/decade), and flicker phase noise to flicker frequency noise (30 dB/decade) at frequencies less than the oscillator composite resonator half-bandwidth. This is the result, in the closed loop oscillator, of the conversion of (open loop) oscillator phase uncertainty to (closed loop) frequency uncertainty due to the requirement in the oscillator, of maintenance of $2\pi n$ radians closed loop phase shift. The degree of phase to frequency conversion is determined by the oscillator composite resonator phase slope $d\phi/df = 2Q/f_o$.

At frequencies in excess of the oscillator resonator half bandwidth, the noise 'floor' level is simply 10 log K2. K2 represents the residual noise of the (open loop) oscillator sustaining stage and can be calculated for the aforementioned circuits using the overall composite resonator out-of-band impedance value appearing between the sustaining stage input transistor junction terminals.

FIG. 2 shows the basic (white) noise sources in the transistor. For further detail regarding such noise sources and related formulae, reference should be made to an article by Van Der Ziel entitled "Noise in Solid State Devices and Lasers", which appeared in the Proceedings of the IEEE, Vol. 58, No. 8, August, 1970, pp 1178-1206. For both the circuits, the values of the impedance of the composite resonator 'out-of-band' (at frequencies offset from the carrier in excess of the resonator half bandwidth), are relatively small. As a result, the emitter shot noise generator plays a dominant role in establishing the oscillator output signal noise floor. For the circuits disclosed above, K2 in the range $10^{-15}$ to $10^{-16}$ rad$^2$/Hz is typical for crystal unit dissipations in the range 100 to 300 microwatts.

SUMMARY OF THE INVENTION

It is therefore an object of the present invention to provide an improved narrow deviation voltage controlled crystal oscillator having an improved noise floor and output signal frequency stability.

In the present invention, a composite resonator is used that is similar to the composite resonator used in U.S. Pat. No. 4,134,085 but the resonator is not imbedded in the base circuit of the sustaining step transistor where it operates as a parallel resonant circuit. Instead it is placed in series with the emitter of the sustaining stage transistor where it operates as a series resonant circuit to provide an improved noise floor.

Also, since the circuit disclosed herein does not require the use of the additional transforming circuitry or spurious suppression circuitry used in the oscillator circuit shown in U.S. Pat. No. 3,571,754, its long term stability is greatly improved.

These and other advantages, objects and features of the invention will become more apparent after considering the following description taken in conjunction with the illustrative embodiment in the accompanying drawings.

DETAILED DESCRIPTION OF THE INVENTION

Figure 3:
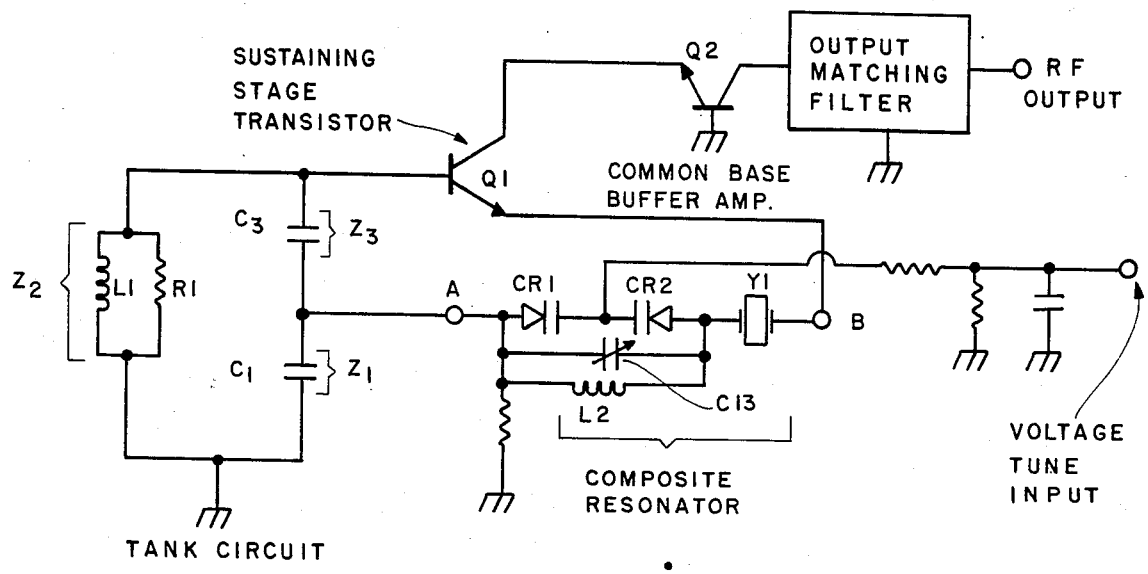
FIG. 3 is a functional schematic diagram of the voltage controlled crystal oscillator of the present invention.

Referring now to FIG. 3 of the drawings, there is shown a functional schematic diagram for the VCXO of the present invention. As shown in FIG. 3, the basic composite resonator similar to that disclosed in U.S. Pat. No. 4,134,085 mentioned above, has been placed in series with the sustaining stage transistor emitter. The resonator includes a quartz crystal Y1 in a series connection with the parallel combination of a pair of varactor diodes CR1 and CR2, a variable compacitor C13 and an inductor L2.

The oscillator of FIG. 3 operates at the series resonant frequency of the composite resonator, and the out-of-band impedance of the composite resonator is large. For example, for a quartz crystal unit Y1 having 1.2 millihenry motional inductance, the composite resonator (reactive) impedance at ±10 KHz from the carrier would be approximately 150 ohms.

Essentially, the sustaining stage transistor Q1 of FIG. 3, acting in combination with the 'tank' circuit elements C1, L1, R1, C3, can be considered a negative resistance generator that presents a negative real impedance across the composite resonator connection terminals.

The value of the impedance presented to the composite resonator can be approximated by $$Z_{in} = \frac{rbb' + Zb'e}{1 + gm(Zb'e)} + \frac{Z2Z3}{(1 + gm(Zb'e))Z_T} + \frac{Z1Z3}{Z_T}$$

The dominant (negative resistance) term is:

$$\frac{Z1Z3}{Z_T} = -\frac{1}{\omega^2 C_1 C_3 r_S}$$

where $r_s$ is the equivalent series resistance of the series combination $Z_1 + Z_2 + Z_3$.

Typically, the elements Z1, Z2, Z3 are chosen so that the negative resistance value is 1.5 to 2 times the positive series resistance of the composite resonator (3 to 6 dB oscillator excess gain).

As shown in FIG. 3, useful oscillator output is extracted from the collector via an extremely low input impedance common base buffer amplifier Q2. This configuration results in extremely good isolation and drastically improves oscillator freqency sensitivity to buffer amplifier output circuit load impedance variations.

It should also be noted that where the circuit of FIG. 3 is utilized as a fixed frequency VHF crystal oscillator employing an overtone crystal unit, the selectivity (Q) of the tank circuit must be made large enough ($Q \approx 10$ typical) to suppress oscillation at the unwanted crystal resonances. For the disclosed embodiment, however, crystal operation is at the fundamental resonance, and much lower value of tank circuit Q (2 to 3 typical) can be used. Low tank circuit selectivity results in substantial improvement (reduction) in oscillator frequency sensitivity to tank circuit element drift.

Figure 1:
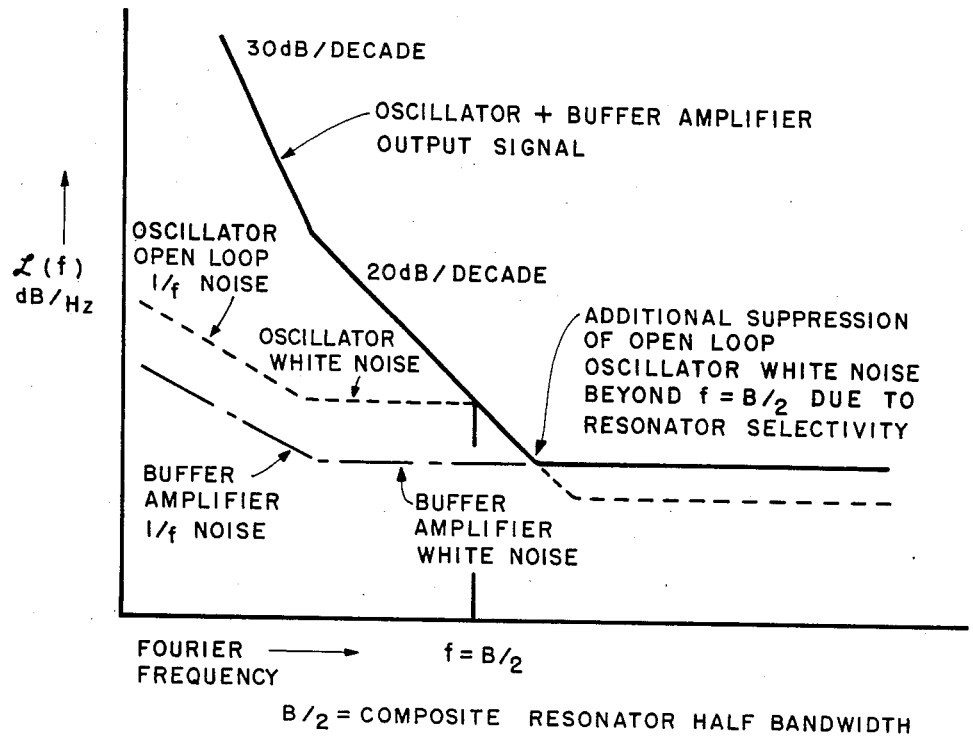
FIG. 1 is a graph depicting phase noise sideband spectra for a narrow deviation voltage controlled crystal oscillator.
Figure 2:
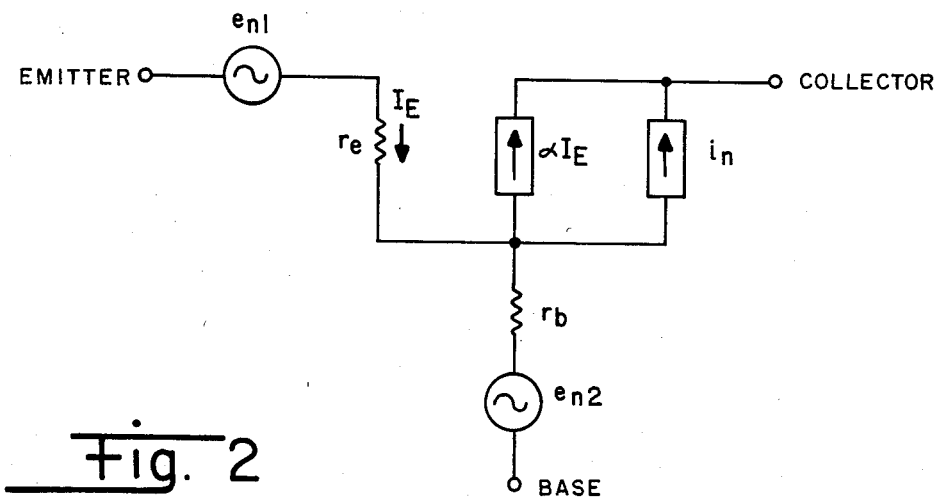
FIG. 2 illustrates a simplified transistor model with associated noise sources.

When consideration is giVen to the effect of a large out-of-band impedance placed in series with the transistor emitter in FIG. 2, it becomes obvious that the effect is to suppress the noise current flowing in the collector due to both emitter shot noise and base resistance Johnson noise. In fact, the method used to determine the value of the collector shot noise generator ($i_n$ in FIG. 2) is to place a large impedance in series with the emitter.

For the circuit of FIG. 3, if the following realistic values are substituted: $I_E \approx 5 \times 10^{-3}$ Amps, $\alpha f \approx 0.95$, $f/f\alpha \approx 0.05$, $r_e \approx 26/I/hd\ E \approx 5$ ohms, the collector noise current due to $i_n \approx 9 \times 10^{-12}$ amp/$\sqrt{Hz}$, where:

$I_E$ = transistor D.C. emitter current
$\alpha f$ = transistor forward current amplification factor
$f\alpha$ = transistor alpha cutoff frequency
$r_e$ = transistor emitter impedance.

If the external emitter impedance is much greater than $Z_E$ and the signal current is approximately 3 mA, the noise to signal ratio in Q1 collector current is $-170$ dB.

In the working oscillator, the external emitter out of band impedance at ±10 KHz offset is approximately 150 ohms. This leads to an additional Q1 collector noise current of $7 \times 10^{-12}$ amp/$\sqrt{Hz}$ due to $e_{n1}$ and $6 \times 10^{-12}$ amp/$\sqrt{Hz}$ due to $e_{n2}$. Total noise to signal ratio is then $-167$ dB. A similar situation exists in the common base buffer amplifier Q2 where the external Q2 emitter impedance is the collector impedance of Q1. In the preferred embodiment of the invention, shown with selected component values in FIG. 4, overall noise to signal ratio of $-164$ dB is obtained, including additional contributions of DC bias resistor noise, etc. This leads to a single sideband phase noise level of $-164 - 6 \approx -170$ db/Hz at frequencies in excess of 10 KHz.

Figure 4:
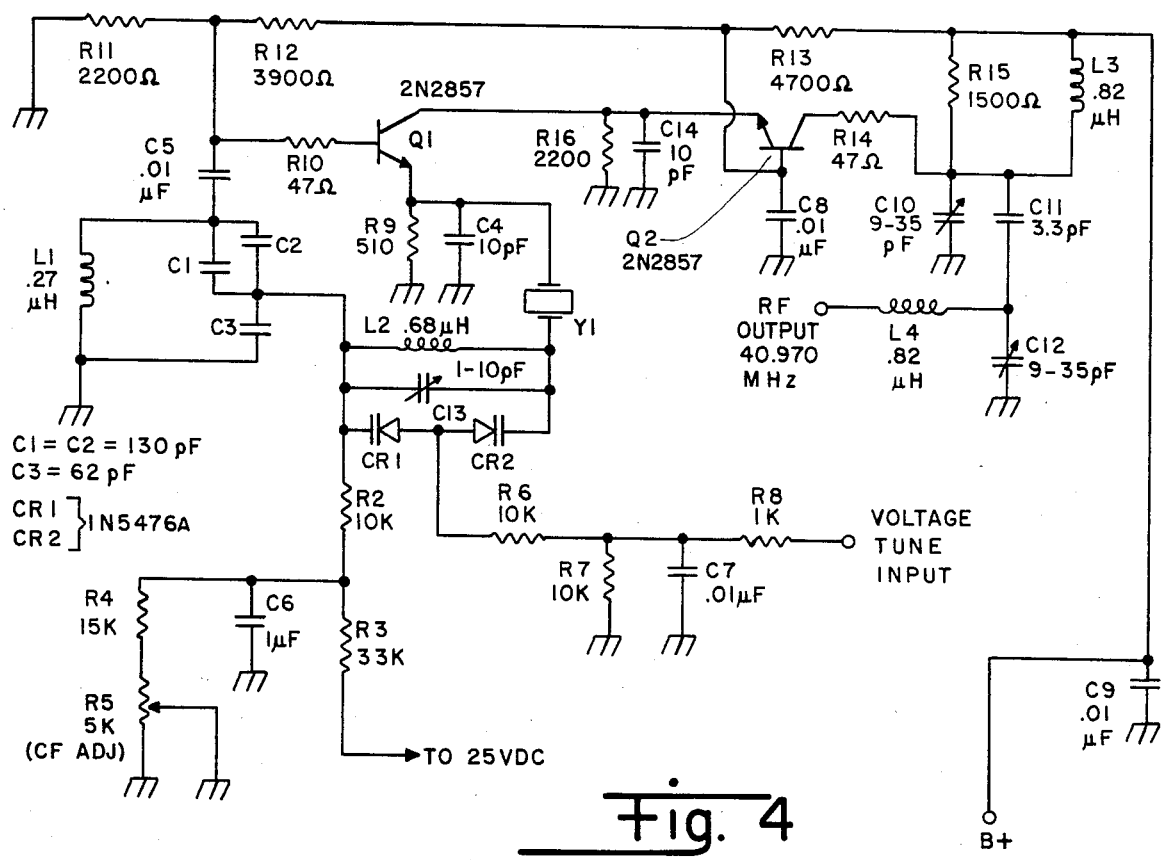
FIG. 4 is a detailed schematic diagram of a voltage controlled crystal oscillator constructed in accordance with the present invention.
Figure 5:
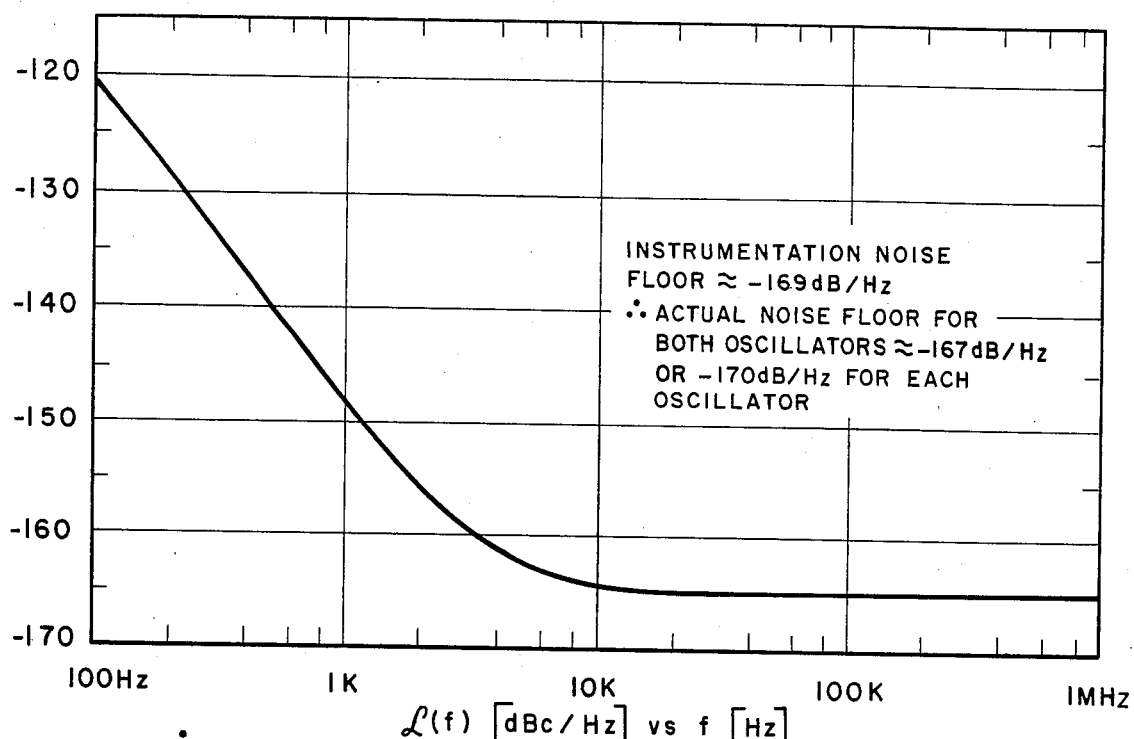
FIG. 5 is a graph depicting the measured short term stability of the voltage controlled crystal oscillator of the present invention.
Figure 6:
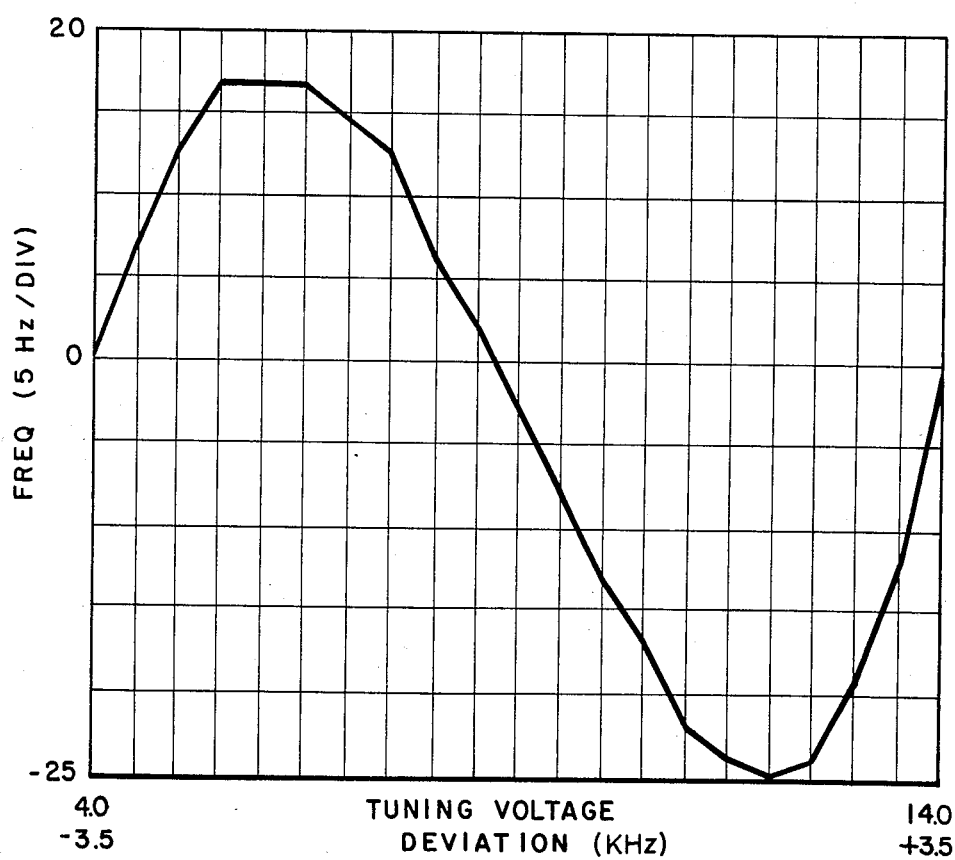
FIG. 6 is a graph depicting the measured linearity of the voltage controlled oscillator shown in FIG. 5 of the drawings.

This result is verified in FIG. 5 which shows the measured phase noise spectral density for two FIG. 4 narrow deviation VCXO's. FIG. 6 shows the measured linearity for the oscillators. Five to one additional improvement in linearity is realizable for 2:1 reduction in applied tuning voltage (at the expense of approximately 2:1 increased circuit sensitivity to composite resonator component changes).

The data depicted in FIG. 5 together with measurements of circuit sensitivity to composite resonator component tolerance, indicate an order of magnitude improvement compared to that exhibited by currently utilized designs for narrow deviation voltage controlled crystal oscillators.

Although the invention has been described with reference to a particular embodiment, it will be understood to those skilled in the art that the invention is capable of a variety of alternative embodiments within the spirit and scope of the appended claims.

What is claimed is:

1. A voltage controlled crystal oscillator comprising:
   a sustaining stage transistor having a base, an emitter and a collector;
   a parallel resonant tank circuit including a first inductor and a pair of serially-connected capacitors coupled between the base of said sustaining stage transistor and a reference terminal;
   a composite resonator having a first terminal coupled to the junction of said first and second capacitors and a second terminal coupled to the emitter of said sustaining stage transistor;
   said composite resonator including a crystal in series connection with the parallel combination of a second inductor and capacitance means,
   said capacitance means including a pair of serially-connected voltage variable capacitance devices;
   means for applying a varactor bias voltage to the junction of said pair of serially-connected voltage variable capacitance devices;
   means coupled between said first terminal of said composite resonator and said reference terminal for providing a direct current path for said varactor bias voltage; and
   means coupled to the collector of said sustaining stage transistor for deriving an output signal from said oscillator.

2. Apparatus as defined in claim 1 wherein said voltage variable capacitance devices are varactor diodes.

3. Apparatus as defined in claim 2 wherein said means coupled to the collector of said sustaining stage transistor for deriving an output signal from said oscillator comprises:
   a second transistor having a base, an emitter and a collector;
   said second transistor having its emitter coupled to the collector of said sustaining stage transistor;
   an output signal terminal; and
   a matching filter coupled between the collector of said second transistor and said output signal terminal.

4. Apparatus as defined in claim 3 wherein said composite resonator further comprises:
   a tuning capacitor connected across said second inductor for adjusting the center frequency of said oscillator.

5. Apparatus as defined in claim 4 wherein said parallel resonant tank circuit further comprises:
   resistive means shunted across said first inductor for adjusting the Q of said parallel resonant tank circuit.

6. Apparatus as defined in claim 5 wherein said means for providing a direct current path for said varactor bias voltage comprises:
   a potentiometer having one end thereof coupled to said first terminal of said composite resonator, the other end thereof coupled to said reference terminal, and the variable contact arm thereof coupled to said reference terminal.

7. Apparatus as defined in claim 6 wherein said crystal is a piezoelectric crystal constructed to operate at its fundamental frequency.

8. Apparatus as defined in claim 6 wherein said crystal is an overtone piezoelectric crystal constructed to operate at a harmonic of its fundamental frequency.

* * * * *

UNITED STATES PATENT AND TRADEMARK OFFICE
CERTIFICATE OF CORRECTION

PATENT NO. : 4,550,293
DATED : 29 October 1985
INVENTOR(S) : Michael M. Driscoll It is certified that error appears in the above-identified patent and that said Letters Patent are hereby corrected as shown below:

In column 4, at line 34, delete the word "giVen" and substitute therefor --given--.

In column 4, at line 45, delete the expression "$r_e \approx 26/I/hd\ E$" and substitute therefor --$r_e \approx 26/I_E$--.

In claim 1, at line 13, delete the word "ccmbination" and substitute therefor --combination--.

Signed and Sealed this

Fourth Day of February 1986

[SEAL]

Attest:

DONALD J. QUIGG

Attesting Officer

Commissioner of Patents and Trademarks